US006909613B2

(12) United States Patent
Augustijn et al.

(10) Patent No.: US 6,909,613 B2
(45) Date of Patent: Jun. 21, 2005

(54) ASSEMBLY COMPRISING AN ELECTRICAL ELEMENT

(75) Inventors: Jeroen Augustijn, Leiden (NL); Onno Geschiere, Amsterdam (NL); Marcel de Blok, Amsterdam (NL)

(73) Assignee: Sonionmicrotronic Nederland B.V., Amsterdam (NL)

( * ) Notice: Subject to any disclaimer, the term of this patent is extended or adjusted under 35 U.S.C. 154(b) by 0 days.

(21) Appl. No.: 09/863,436

(22) Filed: May 24, 2001

(65) Prior Publication Data

US 2002/0050377 A1 May 2, 2002

Related U.S. Application Data

(60) Provisional application No. 60/206,790, filed on May 24, 2000.

(51) Int. Cl.[7] ............................ H05K 5/00; H05K 5/04; H05K 5/06

(52) U.S. Cl. ........................ 361/752; 361/753; 381/386

(58) Field of Search ................................ 361/752–753, 361/800, 822, 823, 748; 381/386, 394, 189, 417; 174/60, 61, 65 R, 68.1–68.3; 439/607, 699, 676, 941

(56) References Cited

U.S. PATENT DOCUMENTS

| | | | | | |
|---|---|---|---|---|---|
| 3,617,653 | A | | 11/1971 | Tibbetts et al. | 179/114 |
| 3,935,398 | A | * | 1/1976 | Carlson et al. | 381/386 |
| 4,691,363 | A | * | 9/1987 | Khanna | 381/394 |
| 5,193,116 | A | | 3/1993 | Mostardo | 381/69 |
| 5,628,653 | A | * | 5/1997 | Haas et al. | 439/607 |

FOREIGN PATENT DOCUMENTS

| | | |
|---|---|---|
| GB | 2301728 A | 12/1996 |
| WO | WO 95/07014 | 3/1995 |

* cited by examiner

*Primary Examiner*—David A. Zarneke
*Assistant Examiner*—Tuan Dinh
(74) *Attorney, Agent, or Firm*—Harness, Dickey & Pierce, PLC

(57) ABSTRACT

The present invention relates to an assembly comprising an electrical element, such as a coil, and especially to an assembly more easily assembled. Assemblies of this type are used for receivers for hearing aids or sound generators for e.g. mobile telephones.

16 Claims, 10 Drawing Sheets

ASSEMBLY COMPRISING AN ELECTRICAL ELEMENT

This application claims priority on provisional Application No. 60/206,790 filed on May 24, 2000, the entire contents of which are hereby incorporated by reference.

FIELD OF THE INVENTION

The present invention relates to an assembly comprising an electrical element, such as a coil, and especially to an assembly more easily assembled. Assemblies of this type are typically used for so-called receivers for hearing aids or sound generators for e.g. mobile telephones.

BACKGROUND OF THE INVENTION

Normally, such assemblies are assembled by providing e.g. the coil, which has an electrical conductor which has to be contacted from the outside of the housing of the assembly in a manner where separate electrical conductors are provided for providing this electrical connection and which have to be connected to the coil. This operation is highly labour intensive, and the present invention relates to a manner of making this operation easier.

SUMMARY OF THE INVENTION

An electro-acoustic transducer includes an electro-acoustic element for receiving an electrical signal and converting it to an audio signal, or for receiving an audio signal and converting it to an electrical signal, a housing, the electro-acoustic element being positioned within the housing, the housing comprising an opening or an indentation at an inner surface thereof, the electro-acoustic transducer assembly further comprising a first projection being attached to the electro-acoustic element or engaging the electro-acoustic element, the first projection being introduced into the opening or indentation when the electro-acoustic element is positioned within the housing.

Thus, providing this projection and opening/indentation, the electro-acoustic element may be kept in place by the interaction of these elements. Compared to the prior art manners of assembling this assembly, this manner is less labour intensive.

Providing indentations in the housing will provide the positioning of the electro-acoustic element but not access to the projections from outside the housing.

A preferred manner is one wherein the housing comprises an opening and wherein the projection is electrically conducting and is electrically connected to one of the inputs/outputs of the electro-acoustic element. In this manner, not only may the projection/hole aid in maintaining the electro-acoustic element in position within the housing, but the input/output of the electro-acoustic element may also be contacted from the outside via this projection. In this manner, not only positioning/maintaining of the electro-acoustic element is provided but also easy electrical contact to the electro-acoustic element without having to provide other electrical connections from outside the housing to the element inside the housing.

Alternative to the providing of a hole would be to provide a housing at least part of which is electrically conducting for the projection to obtain electrical contact to the surroundings via or through the housing.

One manner of providing this type of projection is to provide a solder bump into which is soldered e.g. an electrical conductor connected to or forming an input/output. An alternative to the solder bump would be e.g. a pressure contact.

Especially when the housing comprises two openings and where the assembly further comprises two projections, another projection in addition to the above projection, being attached to the electro-acoustic element or engaging the electro-acoustic element, wherein the other projection is electrically conducting and is electrically connected to the other of the input/output of the electro-acoustic element, is the connection to the electro-acoustic element facilitated. Alternatively, the other of the input/output may be attached to the housing or at least part thereof which is electrically conducting in order for the connection to that input/output to take place via the housing.

It may be preferred that the electro-acoustic element is enclosed within a container, the at least one projection being provided at a surface thereof. The container may comprise a material wherein the electro-acoustic element is at least partly cast-in.

Then, the at least one projection may be displaceable in relation to the electro-acoustic element or at least part of the container. In that situation, the electro-acoustic element and projections may be adapted to be snap-fitted into the housing by the operation of the displaceable projections and the holes or indentations of the housing.

In the present context, a compressible projection may be made of a resilient material in order for a surface thereof to be displaceable in relation to other parts thereof—and this resilient material may be covered by an electrically conductive material if the electrical conductivity of the resilient material itself is not sufficient. Alternatively, a non-compressible projection may be made displaceable using any type of means, such as springs or resilient materials.

More generally, the electro-acoustic element or container preferably comprises a surface at least substantially opposite to a surface comprising a projection, these two surfaces corresponding to corresponding inner surfaces of the housing, where an opening or indentation is provided in the inner surface of the housing corresponding to the surface of the electro-acoustic element or container having the projection.

Thus, no glue or other fastening means need be provided in order to maintain the electro-acoustic element in place. Another advantage of this is seen in situations where it is desired to remove the electro-acoustic element from the housing. This removal is extremely difficult when the electro-acoustic element has been e.g. fastened using glue.

Especially when providing the electro-acoustic element in the container—such as when at least partly casting it into a material—may the electro-acoustic element obtain physical dimensions more easily adaptable to the clicking in action and further for supporting or stabilizing the housing.

The providing of the container may more easily provide the electro-acoustic element with outer dimensions similar to the inner dimensions of at least part of the housing such that if the projection(s) is/are provided at one side thereof, that surface and an opposite surface thereof preferably at least substantially correspond to opposite inner surfaces of the housing. In any situation, the resilient action of the projection preferably ensures that the opposite surface engages the corresponding side of the housing during insertion of the electro-acoustic element (optionally in the container) in the housing and when the projection is forced into the housing until engaging or being positioned within the opening or indentation.

One preferred assembly of the above type is one, the electro-acoustic element includes a coil comprising at least one coiled electrical conductor having two ends, and wherein the first projection is connected to one of the ends of the coil.

An assembly of that type may be for use as a receiver/loud speaker for a hearing aid or a mobile telephone.

Naturally, the advantages of the invention and especially the clicking action and the access to the projections through holes in the housing will be obtained independently of the type and nature of the electro-acoustic element. Thus, this electro-acoustic element may be of any type, such as electrical circuitry, a battery, a coil, a sensor, etc.

An external carrier holding one or more electrically conductive paths may be connected to the projections whereby electrical connection may be established between the assembly and the surroundings. This external carrier may e.g. be a circuit board or a flex-print.

In yet another aspect, the invention relates to a sub assembly having an electro-acoustic element for receiving an electrical signal and converting it to an audio signal, or for receiving an audio signal and converting it to an electrical signal, and one or more projections displaceably attached to or engaging the electro-acoustic element, the one or more projections being electrically conducting an being electrically connected to the electro-acoustic element.

Preferably, the electro-acoustic element is provided within a container and where the projection(s) is/are provided at a surface thereof. This container may be made of a resilient material and/or may be provided by at least partly casting-in the electro-element in a casting material.

In a further aspect, the invention relates to an electro-acoustic transducer assembly comprising an electro-acoustic element for receiving an electrical signal and converting it to an audio signal, or for receiving an audio signal and converting it to an electrical signal, a housing, the electro-acoustic element being positioned within the housing, the housing comprising an opening or an indentation at an inner surface thereof, wherein an electrical input/output terminal for receiving or providing the electrical signal is introduced into the opening or indentation when the electro-acoustic element is positioned within the housing.

Preferably, the electro-acoustic element may comprise two electrical inputs and/or outputs. In addition, the assembly may comprise a carrier comprising two electrically conducting paths, each of said two electrically conducting paths being electrically connected to one of the inputs or outputs of the electro-acoustic element.

In a further aspect, the invention relates to an electro-acoustic transducer assembly comprising an electro-acoustic element for receiving an electrical signal and converting it to an audio signal, or for receiving an audio signal and converting it to an electrical signal, a housing, the electro-acoustic element being positioned within the housing, the housing comprising two plugs at an outer surface thereof, the two plugs being electrically connected to the electro-acoustic when the electro-acoustic element is positioned within the housing.

In a further aspect, the invention relates to a method of assembling an assembly, the method comprising the steps of providing an electro-acoustic element having one or more projections attached or engaged thereto, the one or more projections being displaceable in relation to the electro-acoustic element, providing a housing having at least one opening or one indentation at an inner surface thereof, positioning the electro-acoustic element within the housing in a manner so that each of the one or more projections extends into one of the at least one opening or indentation.

Again, in order to facilitate electrical connection an electro-acoustic element having two projections is provided, each projection being electrically conducting and being electrically connected to the electro-acoustic element, and wherein, a housing with two openings or indentations is provided.

Most preferably, each of the one or more projections is electrically conducting and is electrically connected to the electro-acoustic element.

Again, to facilitate the positioning of the coil in the housing, the electro-acoustic element is positioned within the housing using a clicking action by introducing the one or more projections into the at least one opening or indentation.

The method may comprise the step of positioning, prior to performing step 3), the electro-acoustic element within a container in a manner so that the one or more projections is/are provided at a surface thereof.

In a further aspect, the present invention relates to an electro-acoustic transducer assembly comprising an electro-acoustic element for receiving an electrical signal and converting it to an audio signal, or for receiving an audio signal and converting it to an electrical signal, a housing, the electro-acoustic element being positioned within the housing, the housing comprising an opening or an indentation at an inner surface thereof, the electro-acoustic transducer assembly further comprising a first projection forming part of the electro-acoustic element, the first projection being adapted to be introduced into the opening or indentation when the electro-acoustic element is positioned within the housing.

BRIEF DESCRIPTION OF THE DRAWINGS

In the following, a preferred embodiment of the invention will be described with reference to the drawing wherein.

DETAILED DESCRIPTION OF EXEMPLARY EMBODIMENTS

Figure 1:
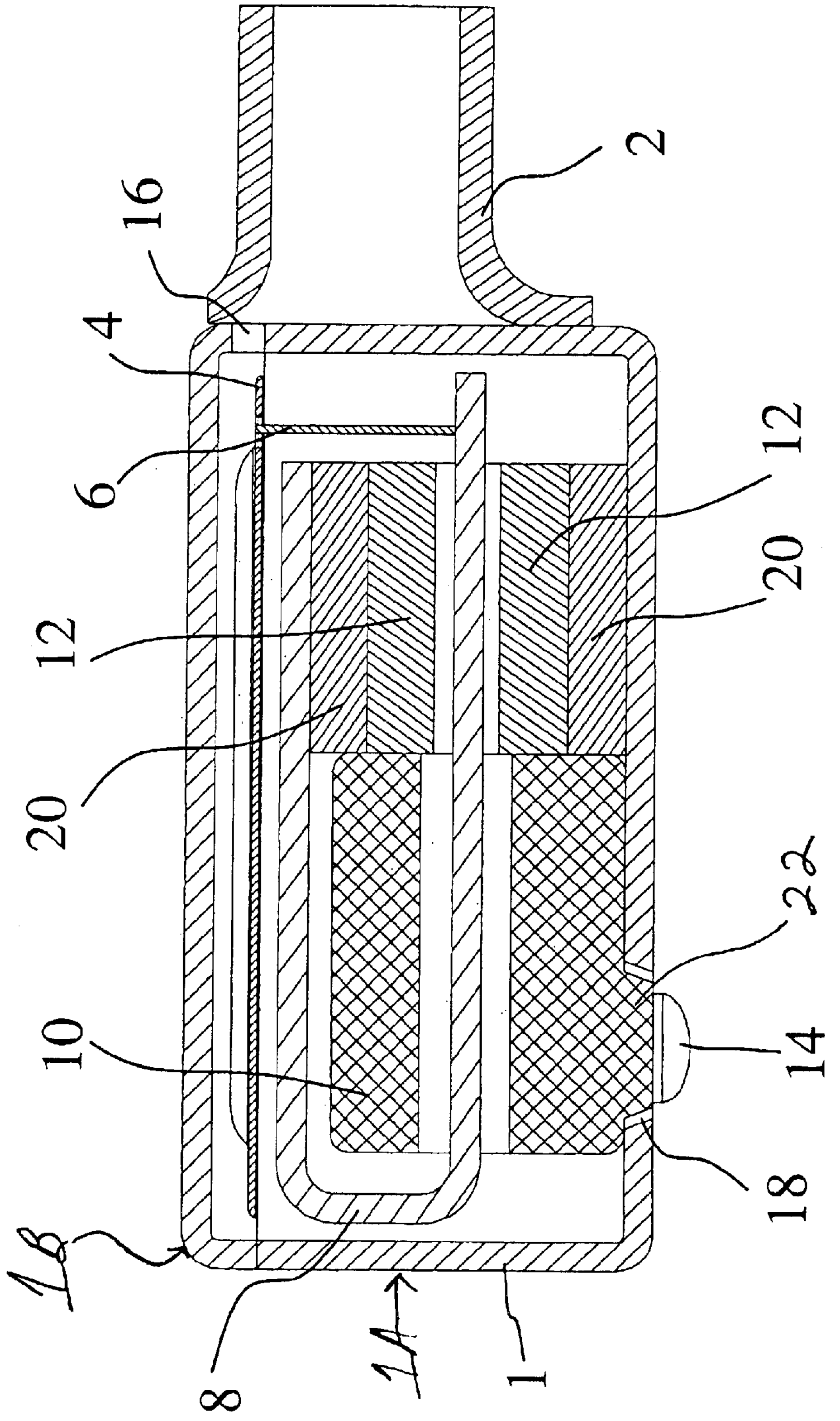
FIG. 1 is a cross sectional view of the preferred embodiment of the invention.
Figure 2:
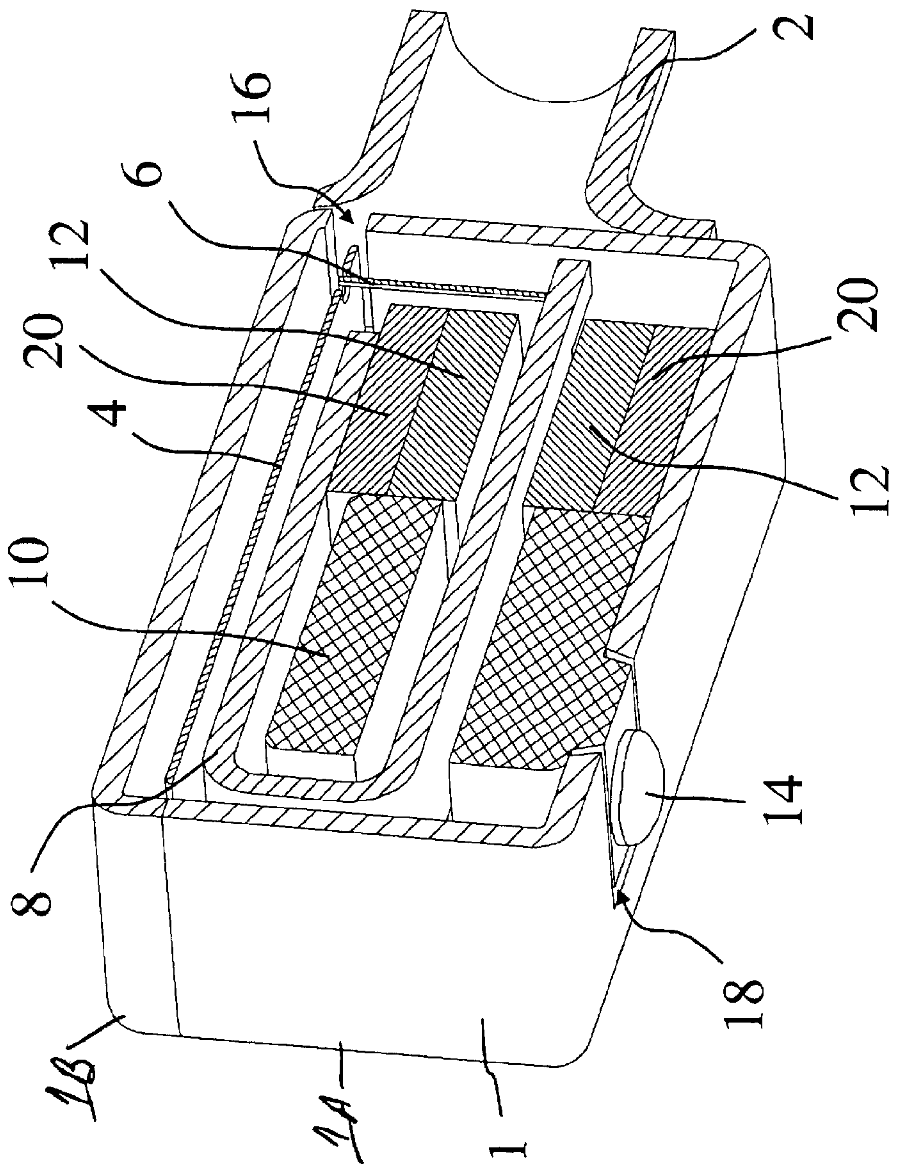
FIG. 2 is an elevational side view of a view of the embodiment of FIG. 1, where half of the receiver has been cut away.

FIGS. 1 and 2 illustrate a preferred receiver for use in a hearing aid. This receiver receives electrical impulses from a signal source, typically comprising a microphone or other transducer, and generates the sound for the user to hear.

This receiver comprises a housing 1 including a top part 1A and a bottom part 1B having a sound output 2, where the sound is generated by a membrane 4 connected via a pin 6 to a so-called armature 8 which is a U-shaped (or optionally E-shaped) metallic member. The armature 8 extends through a coil 10 and magnets 12. The magnets are placed within the housing 1.

One end of the armature 8 is fixed, where the other arm thereof is movably positioned inside the coil 10 and magnets 12.

The overall function of the receiver is that the coil 10 receives electrical impulses via two projections 22 or solder bumps 14, which are connected to an electrical conductor in the coil 10. This will generate a magnetic field in the coil 10 which travels in the armature 8 to the magnets 12 which will then make the "free" end of the armature 8 travel toward on magnet away from the other magnet, and vice versa, whereby the pin 6 will cause the membrane 4 to move in the same direction as the free end of the armature.

The surroundings of the membrane 4 comprise a lower compartment enclosing the coil 10, magnets 12, armature 8, etc, and an upper compartment interconnected with the output 2 via a conduit 16. Thus, the movements of the membrane 4 generate sound output by the output 2. Normally, the membrane will have a so-called pressure-compensating hole.

The top part 1A of the housing 1 has two openings 18 (of which one is illustrated) into (and through) which the solder bumps 14 extend. In this manner, electrical connection to the coil is obtained simply via these solder bumps 14.

The manufacture of the receiver comprises firstly preparing the coil by coiling an electrical conductor. Thereafter, the coil is cast-in in a suitable material on the surface of which the ends of the electrical conductor are soldered into solder bumps 14.

The solder bumps 14 are displaceably mounted so that they may be displaced in a direction toward the coil 10 in order to obtain a clicking action when mounting the coil 10 in the housing 1.

Subsequently, the magnets 12 are fastened to magnet holders 20 and subsequently attached to the cast-in coil 10. Then, the armature 8 is provided.

The subsequent step is the providing of the top part 1A and/or the bottom part 1B of the housing 1 with the openings 18 and with or without the membrane 4 therein, where after the assembly of the coil 10, magnets 12, holders 20, solder bumps 14, and armature 8 is provided in the housing 1 so that the solder bumps 14 extend into the openings 18 so that a clicking action is obtained and the assembly is at least substantially fixed within the housing. Finally, the pin 6 is provided and attached.

Figure 3:
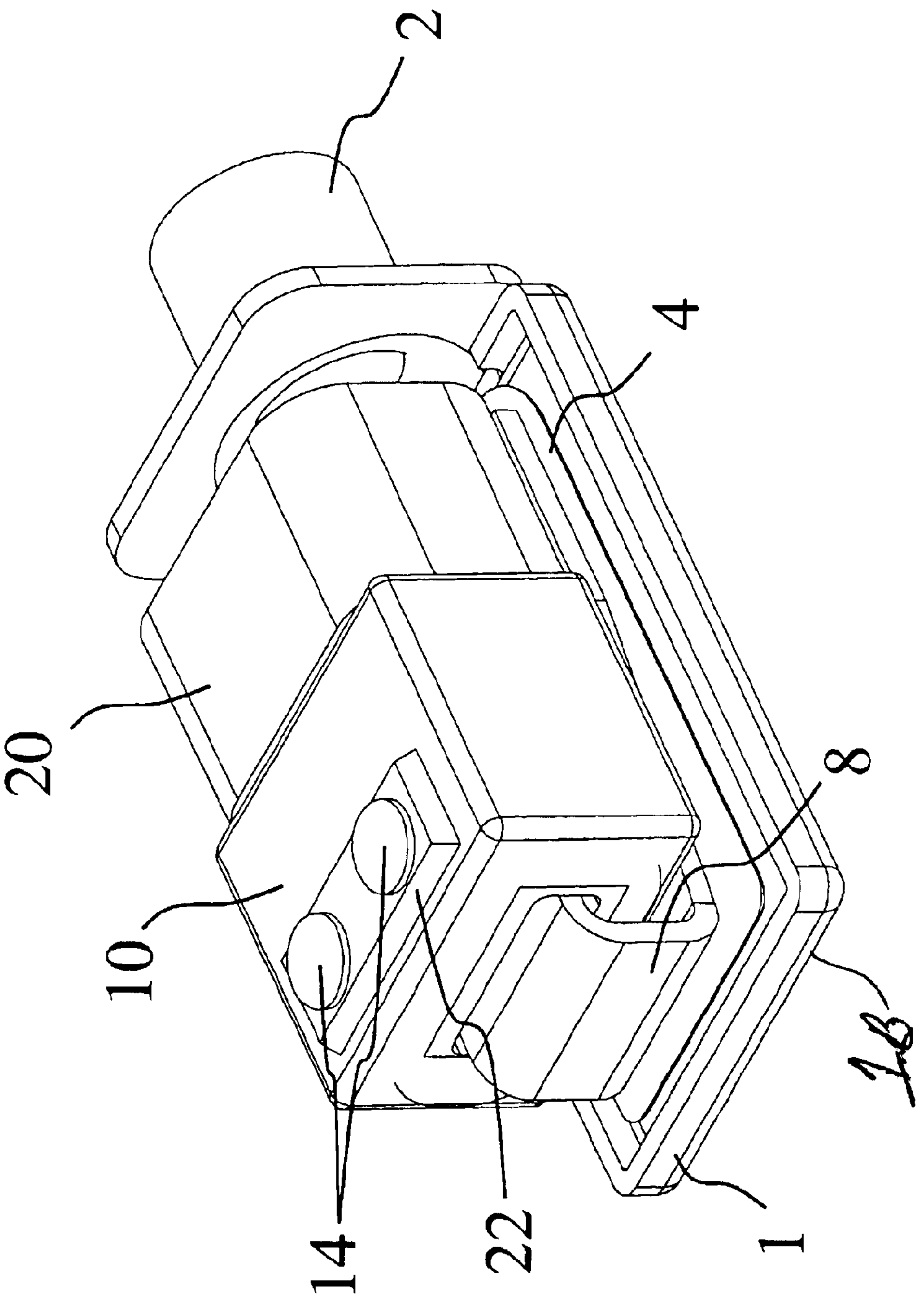
FIG. 3 is an elevational top view of the receiver without the top part of the housing.

FIG. 3 shows a receiver as shown in FIGS. 1 and 2 disassembled—i.e. without the top part 1A of the housing 1. An input/output terminal (combination of solder bumps 14 and projection 22) is shown on top of the coil 10.

Figure 4:
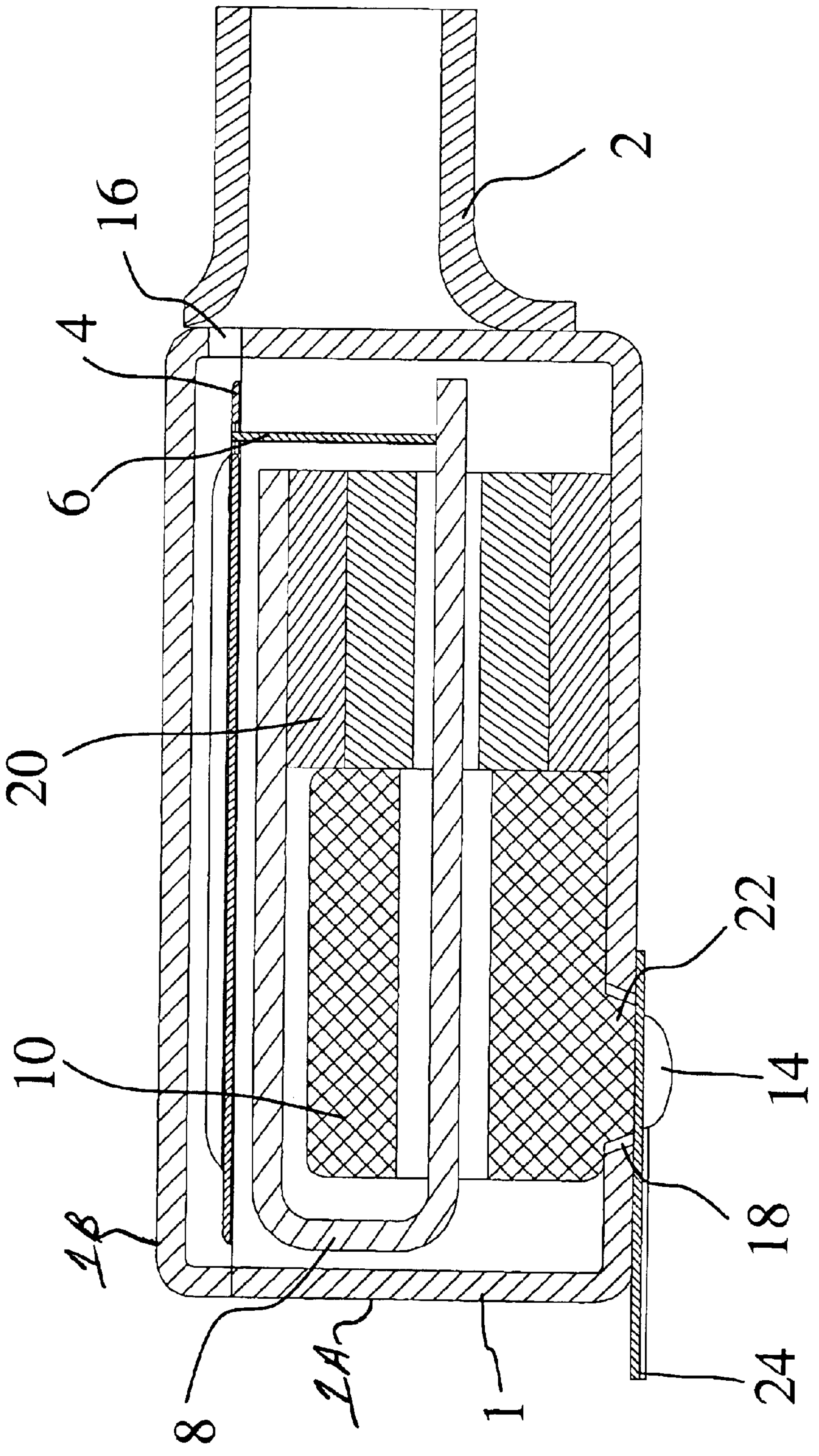
FIG. 4 is a side view of a receiver with e.g. a flex-print attached to the projection.
Figure 5:
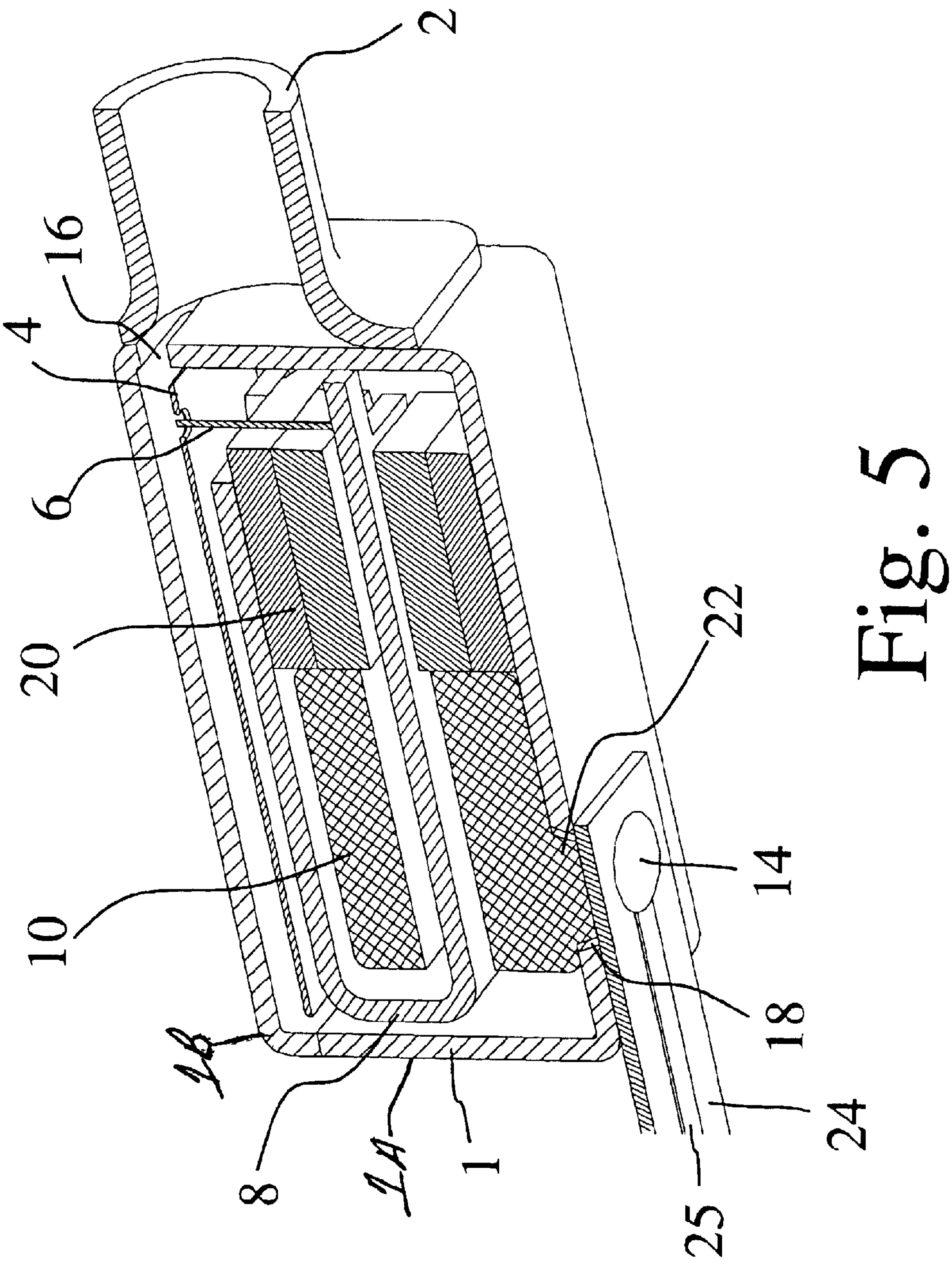
FIG. 5 is an elevational side view of a view of the embodiment of FIG. 4.

FIGS. 4 and 5 show side-views of the preferred receiver, where e.g., a flex-print, a circuit board of e.g., Kapton 24 or any other carrier carrying an electrical conductor 25 is attached to projection 22 whereby electrical contact is established between the conductor on flex-print 25 and one of the ends of coil 10. The conductor 25 may thereby establish electrical connection between one end of coil 10 and other electronic devices/components within the hearing aid.

Figure 6:
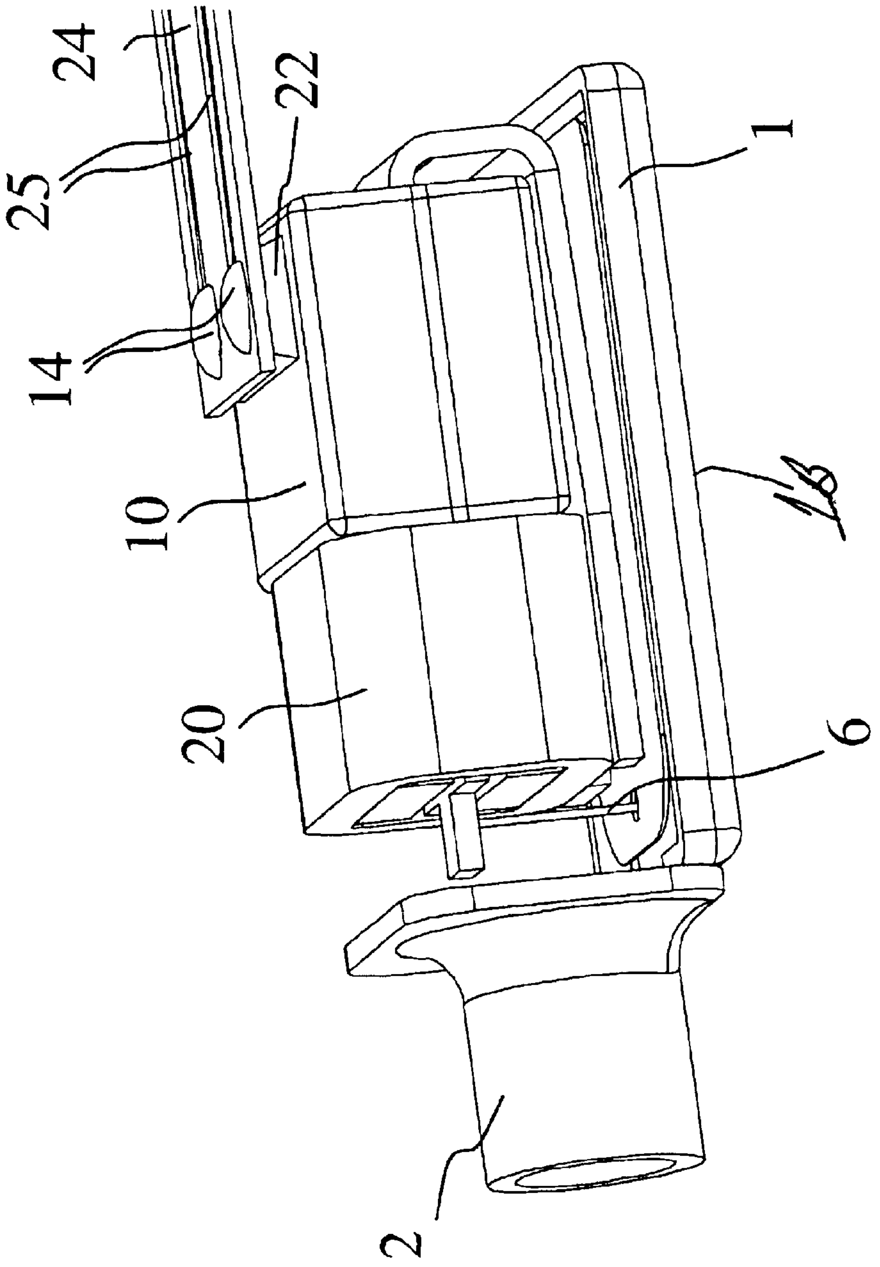
FIG. 6 is an elevational side view as FIG. 5 without half of the receiver cut away, and now with two conductive stripes connected to the projections.
Figure 7:
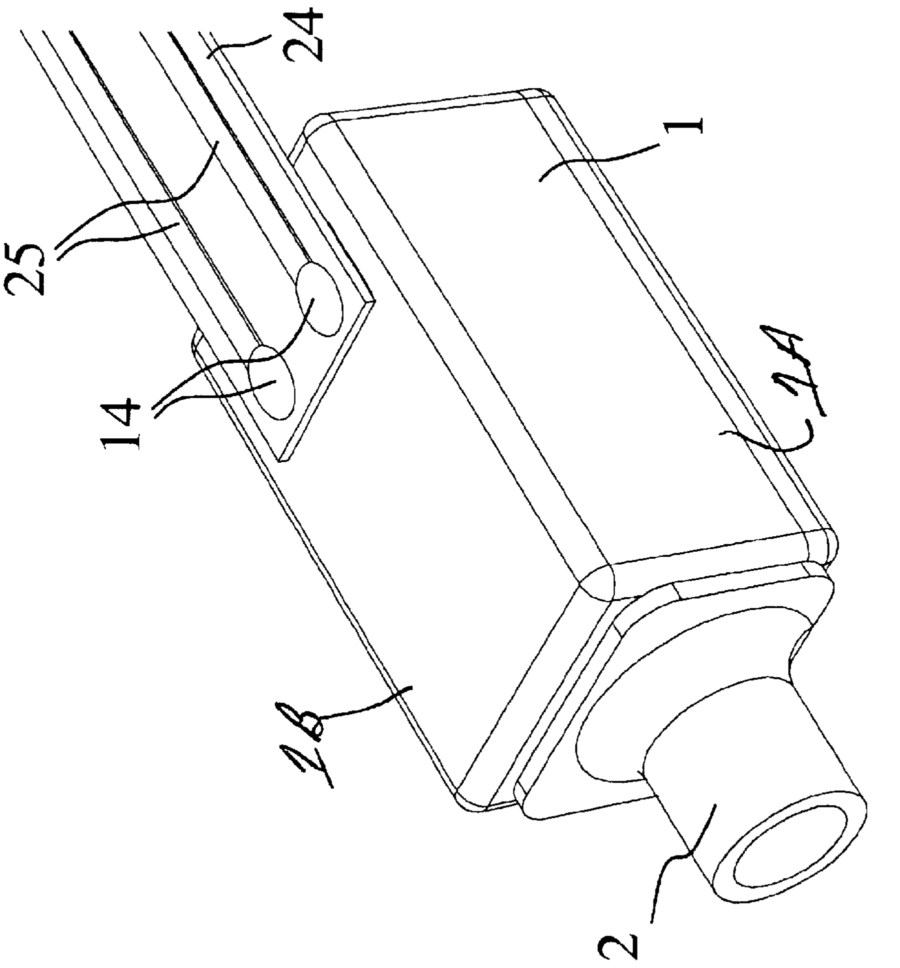
FIG. 7 is an elevational view of a complete receiver with two conductive stripes connected to the projections.

FIGS. 6 and 7 illustrate the situation where each projection 14 is electrically connected to the conductor 25 on the carrier whereby e.g. signals/power generated by external components may be provided to coil 10. FIG. 6 shows the received without the upper part of the housing, whereas FIG. 7 shows the assembled receiver—i.e. with the complete housing.

Figure 8:
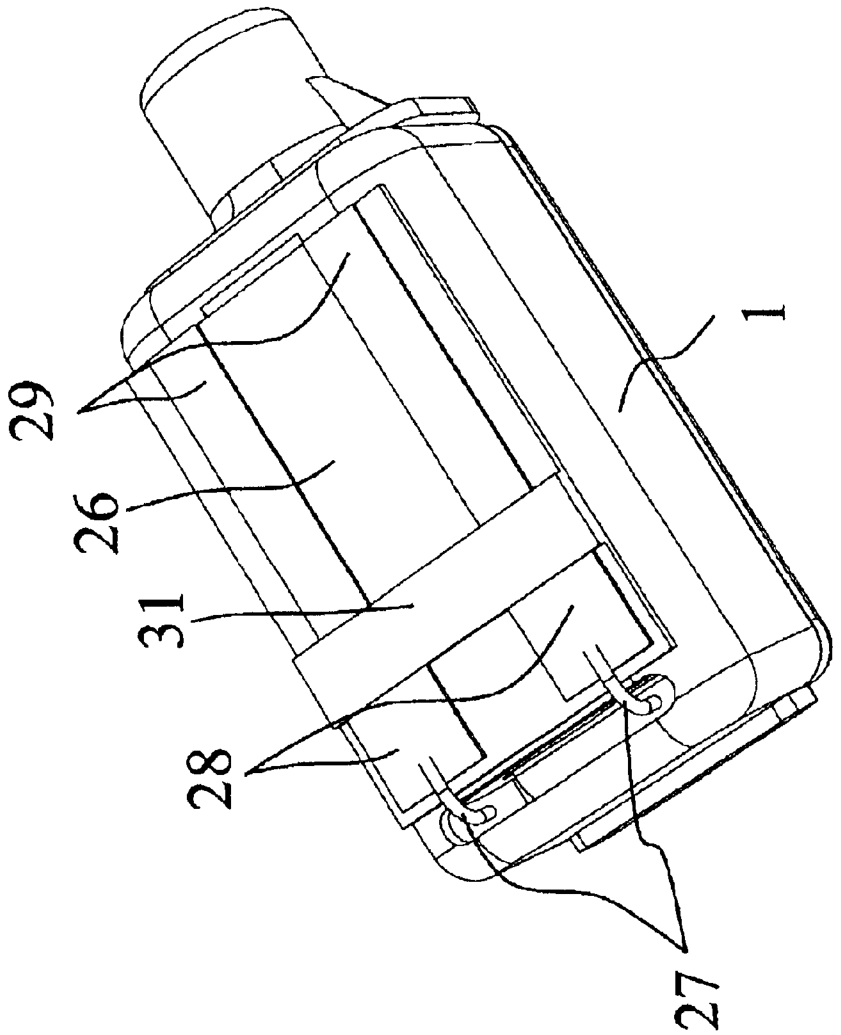
FIG. 8 shows a receiver with a circuit board or flex-print attached to the housing.
Figure 9:
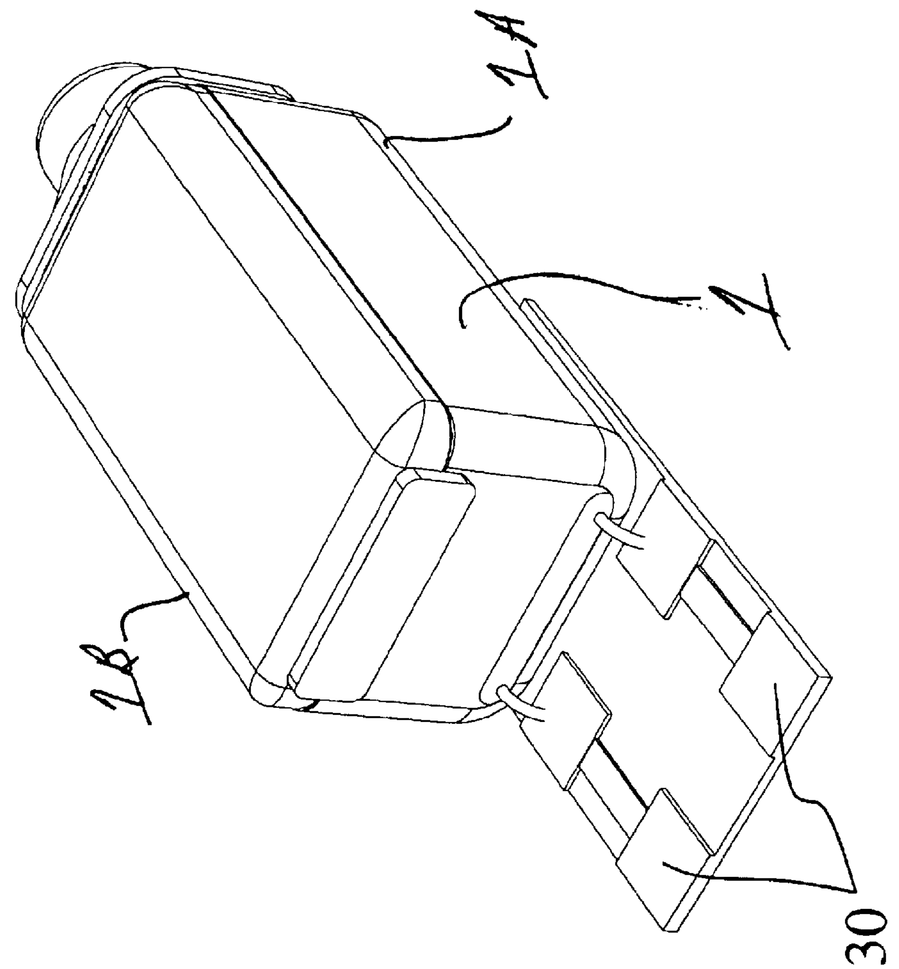
FIG. 9 shows an alternative embodiment to the arrangement shown in FIG. 8, and FIG. 10 also shows an alternative embodiment to the arrangement shown in FIG. 8.

FIGS. 8 and 9 show a receiver with a small circuit board of Kapton or a flex-print 26 positioned on the outside of the housing 1. As seen, the ends of the coil (wires 27 in opening ww) are connected directly to circuit board or flex-print 26 via solder bumps 28. On the circuit board or flex-print one or more gold stripes 29 ensures that electrical connection may be established to external electrical devices or components. The receiver shown in FIGS. 8 and 9 may be used as a plug. The receiver shown in FIG. 9 may also be electrically connected to the surroundings via wires soldered to contact pads 30. Block 31 is positioned between contact pads 28 and gold stripes 29 in FIG. 8. This block prevents the solder material to run, and thereby cover, gold stripes 29.

Figure 10:
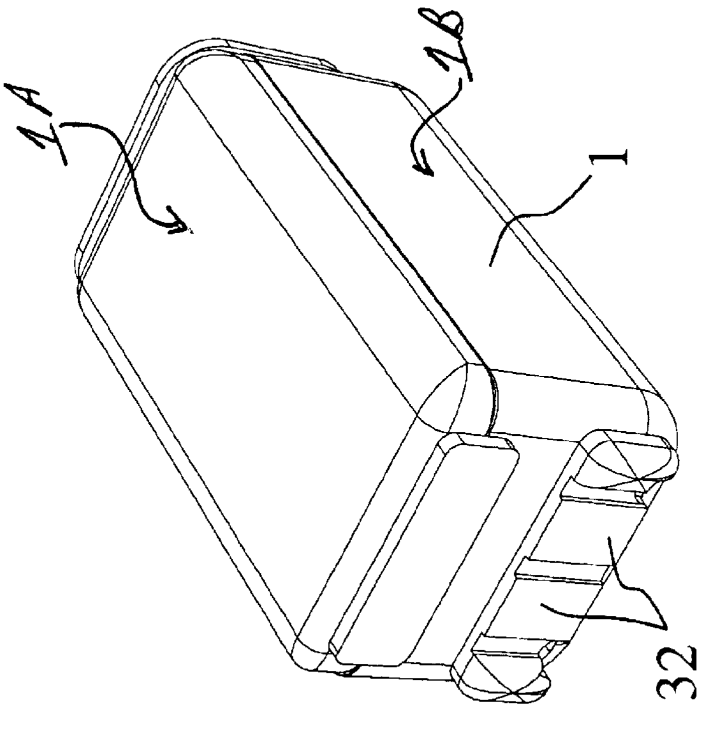

FIG. 10 shows a receiver with connectors/plugs 32 positioned on the back of housing 1. With these connectors, the receiver may be used as a plug whereby the receiver may be easily and conveniently connected to external components, such as external circuit boards, electronic components or other external electronic devices (not shown). The connectors are typically fabricated in a flex-print material.

What is claimed is:

1. A transducer assembly comprising:

a housing having an opening or an indentation at an inner surface thereof, and an electro-magnetic component having a first conductor end, the electro magnetic component being positionable within the housing, the transducer assembly further comprising a first projection, the first projection being in electrical communication with the electro-magnetic component via the first conductor end, the first projection further being susceptible to introduction into the opening or indentation when the electro-magnetic component being installed within the housing, wherein the electro-magnetic component is enclosed within a container, the first projection being provided at a surface thereof, and wherein the container comprises a material wherein the electro-magnetic component is at least partly cast-in.

2. An assembly according to claim 1, wherein the first projection is electrically conducting.

3. An assembly according to claim 1, wherein, at the position of the indentation, the housing is electrically conducting from the inside to the outside of the housing in order to provide electrical contact from outside the housing to the first projection via or through the housing.

4. An assembly according to any claim 1, wherein the first projection is displaceable in relation relative to the electro-magnetic component.

5. An assembly according to claim 1, wherein the electro-magnetic component comprises a coil comprising at least one coiled electrical conductor having two ends, and wherein the first projection is connected to one of the ends of the coil.

6. An assembly according to claim 1, wherein the electro-magnetic component is a loudspeaker.

7. An assembly according to claim 2, wherein the assembly further comprises a second electrically conducting projection being in electrical communication with the electro-magnetic component via a second conductor end, the second projection being introduced into an opening or indentation when the electro-magnetic component is installed within the housing.

8. An assembly according to claim 4, wherein the electro-magnetic component and the first projection are adapted to be snap-fitted into the housing, the snap-fitting being performed by the displaceable first projection and the opening or indentation of the housing in combination.

9. A mobile device comprising an assembly according to claim 6, the mobile device being a hearing aid or a mobile telephone or a personal listening device.

10. A transducer assembly comprising a housing having an opening or an indentation at an inner surface thereof, and an electro-magnetic component having a first conductor end, the electro magnetic component being positionable within the housing, the transducer assembly further comprising a first projection, the first projection being in electrical communication with the electro-magnetic component via the first conductor end, the first projection further being susceptible to introduction into the opening or indentation when the electro-magnetic component being installed within the housing, wherein the first projection is displaceable relative to the electro-magnetic component, and wherein the electro-magnetic component and the first projection are adapted to be snap-fitted into the housing, the snap-fitting being performed by the displaceable first projection and the opening or indentation of the housing in combination.

11. An assembly according to claim 10, wherein the first projection is electrically conducting.

12. An assembly according to claim 10, wherein, at the position of the indentation, the housing is electrically conducting from the inside to the outside of the housing in order to provide electrical contact from outside the housing to the first projection via or through the housing.

13. An assembly according to claim 10, wherein the electro-magnetic component comprises a coil comprising at least one coiled electrical conductor having two ends, and wherein the first projection is connected to one of the ends of the coil.

14. An assembly according to claim 10, wherein the electro-magnetic component is a loudspeaker.

15. An assembly according to claim 11, wherein the assembly further comprises a second electrically conducting projection being in electrical communication with the electro-magnetic component via a second conductor end, the second projection being introduced into an opening or indentation when the electro-magnetic component is installed within the housing.

16. A mobile device comprising an assembly according to claim 14, the mobile device being a hearing aid or a mobile telephone or a personal listening device.

* * * * *